(12) United States Patent
Lee et al.

(10) Patent No.: US 9,828,666 B2
(45) Date of Patent: Nov. 28, 2017

(54) THIN FILM TRANSISTOR ARRAY PANEL HAVING AN OXIDE SEMICONDUCTOR INCLUDING SILICON

(71) Applicant: Samsung Display Co., Ltd., Yongin, Gyeonggi-Do (KR)

(72) Inventors: Hyoung-Rae Lee, Asan-si (KR); Moon Ju Kim, Asan-si (KR); Eun Suk Kim, Asan-si (KR); Seok-Kun Yoon, Seoul (KR); Kwang Youl Lee, Asan-si (KR); Jong-Won Choo, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 39 days.

(21) Appl. No.: 14/463,581

(22) Filed: Aug. 19, 2014

(65) Prior Publication Data

US 2015/0279673 A1  Oct. 1, 2015

(30) Foreign Application Priority Data

Mar. 25, 2014  (KR) .......................... 10-2014-0034915

(51) Int. Cl.
*H01L 21/02*  (2006.01)
*H01L 29/66*  (2006.01)
(Continued)

(52) U.S. Cl.
CPC ............ *C23C 14/08* (2013.01); *C23C 14/086* (2013.01); *C23C 14/352* (2013.01); *C23C 14/562* (2013.01); *H01L 21/02565* (2013.01); *H01L 27/1225* (2013.01); *H01L 29/66969* (2013.01); *H01L 29/7869* (2013.01); *H01L 29/78696* (2013.01); *H01L 21/02631* (2013.01)

(58) Field of Classification Search
CPC ......... H01L 21/02414; H01L 21/02483; H01L 21/02565; H01L 29/7869; H01L 29/78696
See application file for complete search history.

(56) References Cited

U.S. PATENT DOCUMENTS

| | | | |
|---|---|---|---|
| 8,110,850 B2 | 2/2012 | Shim | |
| 2011/0266542 A1* | 11/2011 | Ryu | H01L 27/1225 257/57 |

(Continued)

FOREIGN PATENT DOCUMENTS

| | | |
|---|---|---|
| KR | 101250371 | 3/2013 |
| KR | 1020130024091 A | 3/2013 |

(Continued)

OTHER PUBLICATIONS

Nomura, Kenji, et al., "Room-Temperature Fabrication of Transparent Flexible Thin-Film Transistors Using Amorphous Oxide Semiconductors", Letters to Nature, Nov. 25, 2004, pp. 488-492, vol. 432, Nature Publishing Group, www.nature.com/nature.

*Primary Examiner* — Kevin Parendo
(74) *Attorney, Agent, or Firm* — Innovation Counsel LLP

(57) ABSTRACT

An exemplary embodiment provides a thin film transistor array panel, including: a substrate; an oxide semiconductor layer disposed on the substrate; an insulating layer disposed on the oxide semiconductor layer; and a pixel electrode disposed on the insulating layer. The oxide semiconductor layer includes a first layer and a second layer disposed on the first layer, the second layer includes an oxide semiconductor including silicon, and the second layer contacts the insulating layer.

20 Claims, 12 Drawing Sheets

(51) Int. Cl.
*H01L 29/786* (2006.01)
*H01L 27/12* (2006.01)
*C23C 14/08* (2006.01)
*C23C 14/35* (2006.01)
*C23C 14/56* (2006.01)

(56) References Cited

U.S. PATENT DOCUMENTS

| | | | |
|---|---|---|---|
| 2011/0315980 A1 | 12/2011 | Kim | |
| 2012/0168743 A1 | 7/2012 | Lee et al. | |
| 2012/0280223 A1 | 11/2012 | Kim et al. | |
| 2012/0319103 A1* | 12/2012 | Lee | H01L 29/7869 257/43 |
| 2013/0037797 A1 | 2/2013 | Takechi | |
| 2013/0105865 A1* | 5/2013 | Honda | H01L 29/7869 257/255 |
| 2013/0280859 A1* | 10/2013 | Kim | H01L 29/7869 438/104 |
| 2015/0279673 A1* | 10/2015 | Lee | H01L 21/02631 257/43 |

FOREIGN PATENT DOCUMENTS

| | | |
|---|---|---|
| KR | 101254910 B1 | 4/2013 |
| KR | 1020130093922 A | 8/2013 |

\* cited by examiner

THIN FILM TRANSISTOR ARRAY PANEL HAVING AN OXIDE SEMICONDUCTOR INCLUDING SILICON

CROSS-REFERENCE TO RELATED APPLICATION

This application claims priority to and the benefit of Korean Patent Application No. 10-2014-0034915 filed in the Korean Intellectual Property Office on Mar. 25, 2014, the entire contents of which are incorporated herein by reference.

BACKGROUND (a) Field

The present application relates to a thin film transistor array panel and a manufacturing method thereof.

(b) Description of the Related Art

Display devices such as liquid crystal displays (LCDs), organic light emitting diode displays (OLEDs), electrophoretic displays, and plasma displays include multiple pairs of field generating electrodes and electro-optical active layers interposed therebetween.

The LCD includes a liquid crystal layer as the electro-optical active layer, and the OLED display includes an organic emission layer as the electro-optical active layer.

One of the paired field generating electrodes is generally connected to a switching element to receive an electric signal, and the electro-optical active layer converts the electric signal into an optical signal to display an image.

A display device may include a display panel in which a thin film transistor is formed.

Multiple layers of electrodes, semiconductors, etc. are patterned in such a thin film transistor array panel, and a mask is generally used in a patterning process.

The semiconductor is an important factor in determining the characteristics of the thin film transistor.

The semiconductor is generally formed of amorphous silicon, but due to low charge mobility, there is a limit in manufacturing a high performance thin film transistor.

Further, when polysilicon is used, the high performance thin film transistor is easily manufactured due to high charge mobility, but the cost is high and uniformity is low, thereby making it difficult to manufacture a large-sized thin film transistor array panel.

Accordingly, a thin film transistor using an oxide semiconductor as well as having high charge mobility and a high ON/OFF current ratio compared with amorphous silicon, in addition to having a low cost and high uniformity compared with polysilicon, has been researched.

Particularly, in order for the oxide semiconductor to be applicable to the thin film transistor, it is important to enhance charge mobility and reliability.

The above information disclosed in this Background section is only for enhancement of understanding of the background and therefore it may contain information that does not form the prior art that is already known in this country to a person of ordinary skill in the art.

SUMMARY

Embodiments have been made in an effort to provide a thin film transistor array panel and a manufacturing method thereof that can enhance reliability and ensure favorable charge mobility.

An exemplary embodiment provides a thin film transistor array panel, including: a substrate; an oxide semiconductor layer disposed on the substrate; an insulating layer disposed on the oxide semiconductor layer; and a pixel electrode disposed on the insulating layer. The oxide semiconductor layer includes a first layer and a second layer disposed on the first layer. The second layer includes an oxide semiconductor including silicon, and the second layer contacts the insulating, layer.

The second layer includes the oxide semiconductor including at least one of indium, gallium, zinc, and tin mixed with the silicon.

The first layer may include an oxide semiconductor including at least one of indium, gallium, zinc, and tin.

The insulating layer may include a silicon-based oxide or nitride.

The first layer may be an indium-gallium-zinc oxide semiconductor layer, and the second layer may be an indium-gallium-zinc oxide semiconductor layer doped with the silicon.

The thin film transistor array panel may further include: a gate insulating layer disposed on the substrate; a gate electrode disposed on the gate insulating layer; and source and drain electrodes disposed between the second layer and the insulating layer. The source and drain electrodes may be separated from each other, and the second layer may contact the insulating layer at a separated space between the source and drain electrodes.

The thin film transistor array panel may further include: a gate insulating layer disposed on the substrate; a gate electrode disposed on the gate insulating layer; source and drain electrodes disposed between the second layer and the insulating layer and separated from each other; and a passivation layer covering the source and drain electrodes and contacting the insulating layer in a separated space between the source and drain electrodes.

The thin film transistor array panel may further include: a gate electrode disposed on the insulating layer; an interlayer insulating layer disposed on the gate electrode and including a contact hole; and source and drain electrodes disposed on the interlayer insulating layer and connected to the oxide semiconductor layer through the contact hole.

The second layer may be thinner than the first layer.

Another exemplary embodiment provides a thin film transistor array panel, including: a substrate; an oxide semiconductor layer disposed on the substrate; an insulating layer disposed on the oxide semiconductor layer; and a pixel electrode disposed on the insulating layer. The oxide semiconductor layer includes a first layer and a second layer disposed on the first layer. The first layer includes an oxide semiconductor including at least one of indium, gallium, zinc, and tin. The second layer is an oxide semiconductor doped with a material having a lower standard electrode potential (SEP) than gallium (Ga), and the second layer contacts the insulating layer.

The material having the lower standard electrode potential (SEP) than the gallium (Ga) may be silicon.

A further exemplary embodiment provides a manufacturing method of a thin film transistor array panel, including: forming an oxide semiconductor layer including first and second layers on a substrate; forming an insulating layer on the oxide semiconductor layer; and forming a pixel electrode on the insulating layer. The second layer is formed on the first layer, the second layer is formed of an oxide semiconductor doped with a material having a lower standard electrode potential (SEP) than gallium (Ga), and the second layer is formed to contact the insulating layer.

The oxide semiconductor layer may be formed by a sputtering method, and the first and second layers may be formed by using one sputtering target.

The sputtering target may be formed by combining a plurality of target sheets.

The sputtering target may include a first target region and a second target region, the first target region may include a forming material of the first layer and the second target region may include a forming material of the second layer, and the second target region may be disposed at an outmost side of the sputtering target.

The forming of the oxide semiconductor layer may include sequentially moving the substrate to the first target region and the second target region.

The second layer includes the oxide semiconductor including at least one of indium, gallium, zinc, and tin mixed with silicon.

The first layer may be an oxide semiconductor including at least one of indium, gallium, zinc, and tin.

The material having the lower standard electrode potential (SEP) than the gallium (Ga) may be silicon.

The insulating layer may include a silicon-based oxide or nitride.

According to the exemplary embodiment, the oxide semiconductor layer having a double layer including the first and second layers in which the material having the lower standard electrode potential (SEP) than the gallium (Ga) is doped can be formed.

Thus, the thin film transistor array panel having improved reliability and favorable charge mobility can be provided.

In addition, by forming the double layer of the oxide semiconductor layer using one sputtering target, the double layer of the oxide semiconductor layer can be formed without an additional process and equipment modification.

DETAILED DESCRIPTION OF THE EMBODIMENTS

Figure 1:
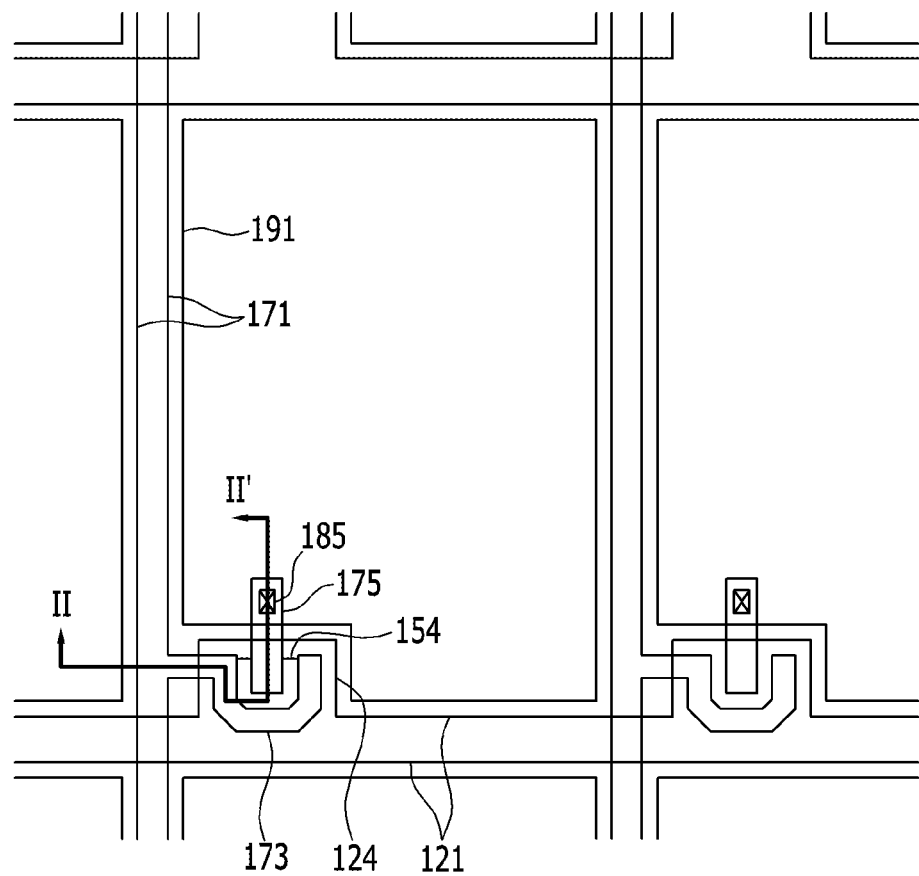
FIG. 1 is a top plan view of a thin film transistor array panel according to an exemplary embodiment.

The inventive concept will be described more fully hereinafter with reference to the accompanying drawings, in which exemplary embodiments are shown.

As those skilled in the art would realize, the described embodiments may be modified in various different ways, all without departing from the spirit or scope of the inventive concept.

On the contrary, exemplary embodiments introduced herein are provided to make disclosed contents thorough and complete and to sufficiently transfer the spirit of the inventive concept to those skilled in the art.

In the drawings, the thickness of layers and regions may be exaggerated for clarity.

In addition, when a layer is described to be formed on another layer or on a substrate, this means that the layer may be formed on the other layer or on the substrate, or a third layer may be interposed between the layer and the other layer or the substrate.

Like reference numerals designate like elements throughout the specification.

FIG. 1 is a top plan view of a thin film transistor array panel according to an exemplary embodiment.

Figure 2:
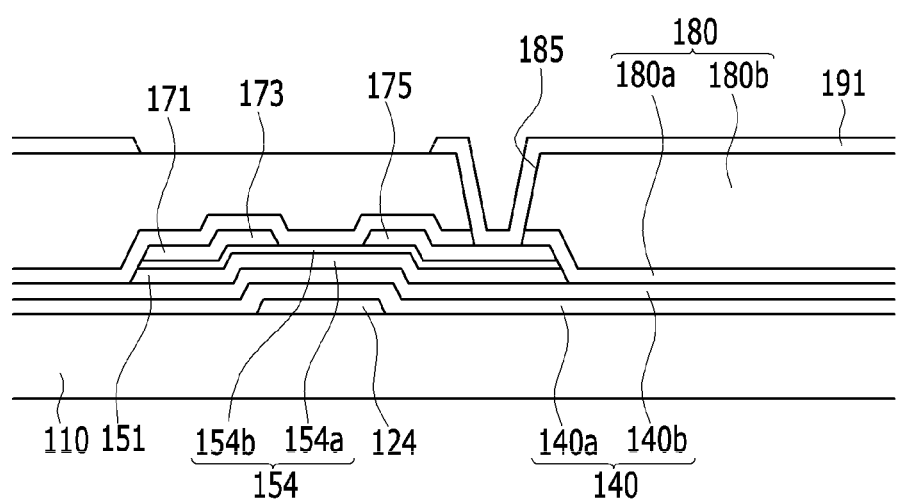
FIG. 2 is a cross-sectional view of FIG. 1 taken along the line II-II'.

FIG. 2 is a cross-sectional view of FIG. 1 taken along the line II-II'.

Referring to FIGS. 1 and 2, a plurality of gate lines 121 are formed on a first substrate 110 formed of transparent glass or plastic.

The gate lines 121 transmit gate signals, and mainly extend in a horizontal direction.

Each gate line 121 includes a plurality of gate electrodes 124 protruding therefrom.

The gate electrode 124 does not necessarily protrude from the gate line 121, and may be a portion of the gate line 121 overlapping an oxide semiconductor layer 154, which is disposed between a source electrode 173 and a drain electrode 175 and will be described later.

The gate line 121 and the gate electrode 124 may be formed of one selected from an aluminum-based metal including aluminum (Al) and an aluminum alloy, a silver-based metal including silver (Ag) and a silver alloy, and a copper-based metal including copper (Cu) and a copper alloy.

In the present exemplary embodiment, the gate line 121 and the gate electrode 124 are formed as a single layer, but they are not limited thereto, and may be formed of a double layer or a triple layer.

When being formed of a double layer, the gate line 121 and the gate electrode 124 may be formed to have a lower layer and an upper layer. The lower layer may be formed of one selected among a molybdenum-based metal including molybdenum (Mo), a molybdenum alloy, chromium (Cr), a chromium alloy, titanium (Ti), a titanium alloy, tantalum (Ta), a tantalum alloy, manganese (Mn), and a manganese alloy.

The upper layer may be formed of one selected among an aluminum-based metal including aluminum (Al) and an aluminum alloy, a silver-based metal including silver (Ag) and a silver alloy, and a copper-based metal including copper (Cu) and a copper alloy.

In the case of a triple layer, layers having different physical properties are formed to be adjacent to each other.

A gate insulating layer 140 is formed on the gate line 121.

The gate insulating layer 140 may include a first insulating layer 140a and a second insulating layer 140b.

The first insulating layer 140a may be formed of a silicon nitride ($SiN_x$) having a thickness of about 4000 Å, and the second insulating layer 140b may be formed of a silicon oxide ($SiO_x$) having a thickness of about 500 Å.

In another exemplary embodiment, the first insulating layer 140a may be formed of silicon oxynitride (SiON), and the second insulating layer 140b may be formed of a silicon oxide ($SiO_x$).

In the present exemplary embodiment, the gate insulating layer 140 may be formed of a double layer, e.g., the first and second insulating layers 140a, 140b, but may be formed of a single layer.

Oxide semiconductor layers 151 and 154 are disposed on the gate insulating layer 140.

The oxide semiconductor layer 151, sometimes called a vertical portion 151, extends in a vertical direction at a lower end of the data line 171. The oxide semiconductor layer 154, sometimes called a projection 154, extends toward the gate electrode 124 from the vertical portion 151.

The oxide semiconductor layer 154 according to the present exemplary embodiment includes a first layer 154a and a second layer 154b. The first layer 154a includes an oxide semiconductor including at least one of indium (In), gallium (Ga), zinc (Zn), and tin (Sn). The second layer 154b includes forming materials of the first layer 154a doped with a first material. The oxide semiconductor of the first and second layers 154a, 154b may not be explicitly referenced in all of the following embodiments discussed below for simplicity but it is to be understood that the first and second layers 154a, 154b include the oxide semiconductor in some or all of the embodiments.

The second layer 154b is disposed on the first layer 154a.

The first material has a lower standard electrode potential (SEP) than gallium (Ga), and may generally be silicon (Si).

Forming materials of the second layer 154b may be the same as the forming materials of the first layer 154a except for the first material, but they are not necessarily the same and may include the first material as well as at least one of indium (In), gallium (Ga), zinc (Zn), and tin (Sn).

A plurality of data lines 171 respectively connected to a plurality of source electrodes 173 and a plurality of drain electrode 175 formed separately from the plurality of source electrodes 173 are formed on the oxide semiconductor layers 151 and 154.

The data lines 171 transmit data signals, and mainly extend in a vertical direction to cross the gate line 121.

Each data line 171 is connected to the plurality of source electrode 173 that extend toward the gate electrode 124 in a U shape.

The drain electrode 175 is separated from the data line 171, and is upwardly elongated at a center of the U shape of the source electrode 173.

Shapes of the source and drain electrodes 173 and 175 are exemplarily illustrated and may be modified in various ways.

Data wire layers 171, 173, and 175 including the data line 171, the source electrode 173, and the drain electrode 175 may be formed of one selected among an aluminum-based metal including aluminum (Al) and an aluminum alloy, a silver-based metal including silver (Ag) and a silver alloy, and a copper-based metal including copper (Cu) and a copper alloy.

In the present exemplary embodiment, the data line 171, the source electrode 173, and the drain electrode 175 are formed of a single layer, but they are not limited thereto, and may be formed of a double layer or a triple layer.

When being formed of the double layer, the data line 171, the source electrode 173, and the drain electrode 175 may be formed of a lower layer and an upper layer. The lower layer may be formed of one selected among a molybdenum-based metal including molybdenum (Mo), a molybdenum alloy, chromium (Cr), a chromium alloy, titanium (Ti), a titanium alloy, tantalum (Ta), a tantalum alloy, manganese (Mn), or a manganese alloy, and the upper layer may be formed of one selected among an aluminum-based metal including aluminum (Al) and an aluminum alloy, a silver-based metal including silver (Ag) and a silver alloy, and a copper-based metal including copper (Cu) and a copper alloy.

In the case of a triple layer, layers having different physical properties are formed to be adjacent to each other.

The oxide semiconductor layers 151 and 154, e.g., the projection 154, exposed portions not covered by the source and drain electrodes 173 and 175 are provided therebetween.

The oxide semiconductor layers 151 and 154 substantially have the same planar pattern as the data line 171, the source electrode 173, and the drain electrode 175 except for the exposed portions.

That is, the data line 171 and side walls of the source and drain electrodes 173 and 175 may be aligned to be substantially the same as side walls of the oxide semiconductor layers 151 and 154 disposed thereunder.

This is because the data wire layers 171, 173, and 175 including the data line 171, the source electrode 173, and the drain electrode 175 and the oxide semiconductor layers 151 and 154 are formed by using the same mask and etchant.

However, since such a structural characteristic is applied to one exemplary embodiment, when different masks are used to form the oxide semiconductor layers 151 and 154 and the data wire layers 171, 173, and 175, the side walls of the oxide semiconductor layers 151 and 154 may not be the same as the side walls of the data wire layers 171, 173, and 175.

One gate electrode 124, one source electrode 173, and one drain electrode 175 form one thin film transistor (TFT) together with the oxide semiconductor layer 154, and a channel of the TFT is formed in the projection 154 between the source and drain electrodes 173 and 175.

Hereinafter, the projection 154 shall be referred to as the oxide semiconductor layer 154.

A passivation layer 180 is formed on the data line 171, the drain electrode 175, and the exposed oxide semiconductor layer 154.

A top surface of the oxide semiconductor layer 154 may contact the passivation layer 180.

A plurality of pixel electrodes 191 are formed on the passivation layer 180.

The pixel electrode 191 is physically and electrically connected to the drain electrode 175 through a contact hole 185 such that it is applied with a data voltage from the drain electrode 175.

Hereinafter, in the thin film transistor array panel according to the exemplary embodiment, the thin film transistor including the oxide semiconductor layer will be described in detail.

Figure 3:
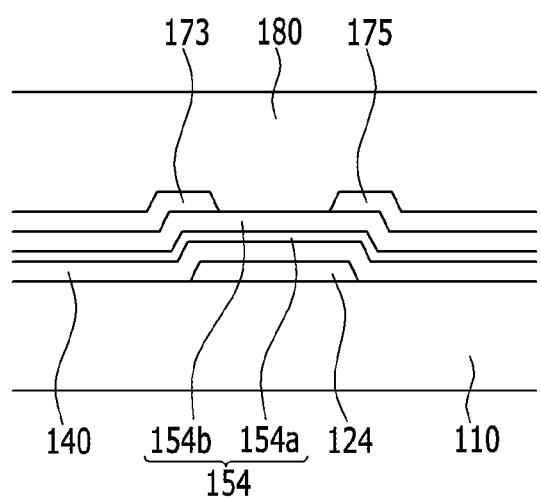
FIGS. 3 and 4 are cross-sectional views of a thin film transistor portion of the thin film transistor array panel according to an exemplary embodiment.
Figure 4:
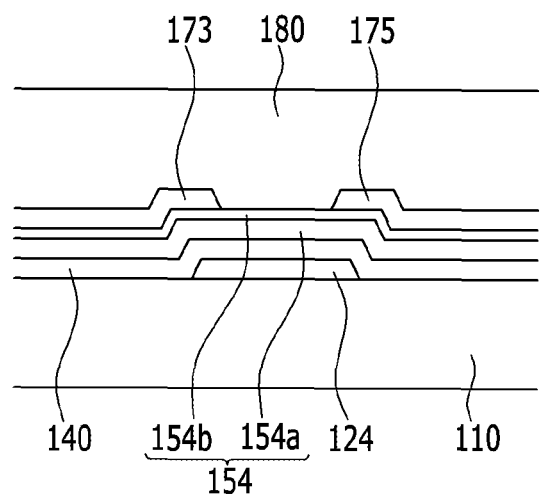

FIGS. 3 and 4 are cross-sectional views of a thin film transistor portion of the thin film transistor array panel according to an exemplary embodiment.

Referring to FIG. 3, the oxide semiconductor layer 154 consists of the first layer 154a and the second layer 154b formed thereon.

As described above, the first layer 154a according to the exemplary embodiment includes at least one of indium (In), gallium (Ga), zinc (Zn), and tin (Sn). The second layer 154b includes a group of materials including at least one of indium (In), gallium (Ga), zinc (Zn), and tin (Sn) doped with the first material.

The first material according to the exemplary embodiment has a lower standard electrode potential (SEP) than gallium (Ga), and may generally be silicon (Si).

In this case, "doped with the first material" may refer to a state in which the oxide semiconductor including at least one of indium (In), gallium (Ga), zinc (Zn), and tin (Sn) is mixed with the first material.

In one exemplary embodiment, a sputtering target including a silicon-indium-gallium-zinc oxide semiconductor can be used to form the second layer 154b.

Silicon (Si) is less affected by external stress because it has a higher bonding strength than gallium (Ga).

In addition, since silicon (Si) has a low standard electrode potential (SEP), absorption and attachment/detachment of moisture (H2O) and oxygen (O2) on a back channel interfacing surface decrease.

Thus, as a more stable material than gallium (Ga), silicon (Si) may be included in a channel layer to improve reliability.

Referring to FIGS. 3 and 4, thicknesses of the first and second layers 154a and 154b are different from each other.

The second layer 154b is thicker than the first layer 154a in the exemplary embodiment illustrated in FIG. 3, and the first layer 154a is thinner than the second layer 154b in the exemplary embodiment illustrated in FIG. 4.

Hereinafter, characteristic variations of the thin film transistor according to thickness differences between the first and second layers 154a and 154b will be described with reference to FIG. 8.

Figure 8:
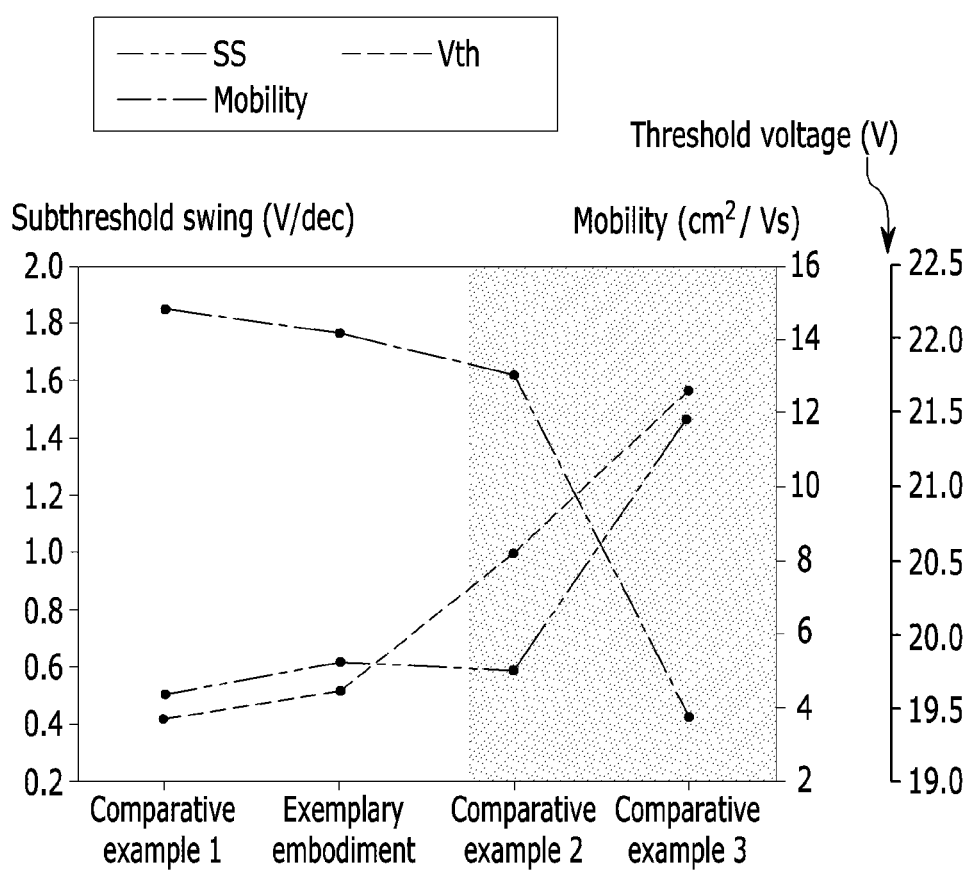
FIG. 8 is a graph showing characteristics of the thin film transistor according to a comparative example and the exemplary embodiment.

FIG. 8 is a graph showing characteristics of the thin film transistor according to a comparative example and the exemplary embodiment.

In FIG. 8, Comparative Example 1 shows a case in which the thin film transistor is formed as a single layer of an amorphous oxide semiconductor layer including indium-gallium-zinc. The exemplary embodiment shows a case in which, like the thin film transistor illustrated in FIG. 4, the first layer 154a is formed in a thickness of 40 nanometers and the second layer 154b is formed in a thickness of 20 nanometers.

Comparative Example 2 show a case in which, like the thin film transistor illustrated in FIG. 3, the first layers 154a is formed in a thickness of 20 nanometers and the second layer 154b is formed in a thickness of 40 nanometers. Comparative Example 3 shows a case in which the thin film transistor is formed as a single layer of an amorphous oxide semiconductor layer including silicon-indium-gallium-zinc.

Referring to FIG. 8, in the case of Comparative Example 1, charge mobility is high and a sub-threshold swing (SS) and a threshold voltage (Vth) are small. In the case of Comparative Example 3, charge mobility is very low and a sub-threshold swing (SS) and a threshold voltage (Vth) significantly increase.

In the case of the thin film transistor according to the exemplary embodiment, there is no problem in actually forming the thin film transistor because it has a level of characteristics similar to Comparative Example 1.

In the case of Comparative Example 2, compared with the exemplary embodiment, charge mobility is lower, a sub-threshold swing (SS) minimally changes, but a threshold voltage (Vth) increases.

In FIG. 3, when the second layer 154b including silicon is thicker, charge mobility may decrease due to silicon having high bonding strength.

Referring back to FIG. 4, in the thin film transistor according to the exemplary embodiment, the oxide semiconductor layer 154 is preferably formed such that the second layer 154b is thinner than the first layer 154a.

The second layer 154b contacts the passivation layer 180 disposed thereon.

In the present exemplary embodiment, the second layer 154b is disposed in a back channel portion of the oxide semiconductor layer 154.

Figure 5:
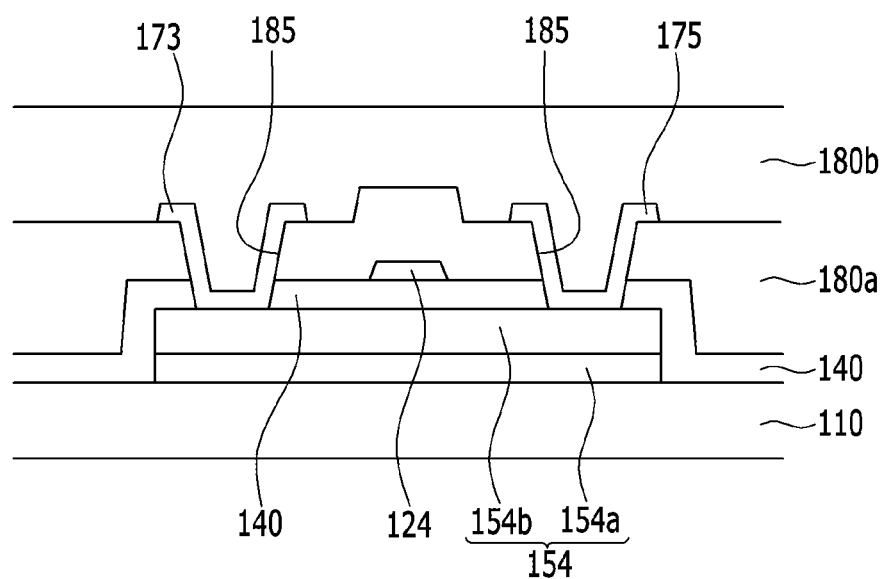
FIG. 5 is a cross-sectional view of a thin film transistor portion of a thin film transistor array panel according to an exemplary embodiment.

FIG. 5 is a cross-sectional view of a thin film transistor portion of a thin film transistor array panel according to an exemplary embodiment.

Referring to FIG. 5, unlike the exemplary embodiment of FIG. 4 showing a bottom gate structure, a top gate structure is illustrated.

In detail, an oxide semiconductor layer 154 is formed on a first substrate 110.

The oxide semiconductor layer 154 includes a first layer 154a and a second layer 154b formed on the first layer 154a.

The first layer 154a includes at least one of indium (In), gallium (Ga), zinc (Zn), and tin (Sn). The second layer 154b includes a group of materials including at least one of indium (In), gallium (Ga), zinc (Zn), and tin (Sn) doped with a first material.

The description of the first material described above in FIGS. 3 and 4 can be applicable.

A gate insulating layer 140 covering the oxide semiconductor layer 154 is formed on the substrate 110.

A gate electrode 124 is formed on the gate insulating layer 140, and an interlayer insulating layer 180a is formed on the gate electrode 124.

A source electrode 173 and a drain electrode 175 are formed on the interlayer insulating layer 180a, and the source and drain electrodes 173 and 175 contact the second layer 154b of the oxide semiconductor layer 154 through a contact hole 185 formed in the insulating layer 140 and the interlayer insulating layer 180a.

A passivation layer 180b is formed on the source and drain electrodes 173 and 175.

Figure 6:
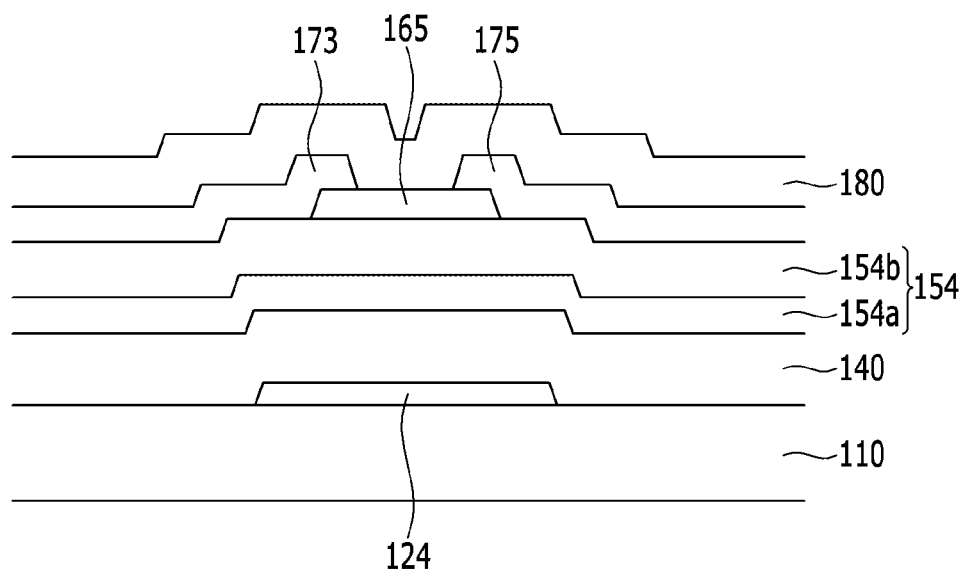
FIG. 6 is a cross-sectional view of a thin film transistor portion of a thin film transistor array panel according to an exemplary embodiment.

FIG. 6 is a cross-sectional view of a thin film transistor portion of a thin film transistor array panel according to an exemplary embodiment.

Referring to FIG. 6, unlike the exemplary embodiment of FIG. 4 showing the bottom gate structure and the exemplary embodiment of FIG. 5 showing the top gate structure, an etch stopper structure is illustrated.

In detail, a gate electrode 124 corresponding to a control electrode in the thin film transistor is formed on a substrate 110, and a gate insulating layer 140 is formed on the substrate 110 to cover the gate electrode 124.

The gate insulating layer 140 may be formed of a silicon oxide, a silicon nitride, or a silicon oxynitride (SiON), and may be formed by a sputtering method.

The gate insulating layer 140 may be formed as a double layer of a silicon oxide and a silicon nitride, or a silicon oxide and a silicon oxynitride In this case, the layer formed of a silicon oxide may be adjacent to the semiconductor layer 154 that will be described later.

An oxide semiconductor layer 154 is formed on the gate insulating layer 140.

The oxide semiconductor layer 154 includes a first layer 154a and a second layer formed on the first layer 154a.

The first layer 154a includes at least one of indium (In), gallium (Ga), zinc (Zn), and tin (Sn). The second layer 154b includes a group of materials including at least one of indium (In), gallium (Ga), zinc (Zn), and tin (Sn) doped with a first material.

The description of the first material described above in FIGS. 3 and 4 can be applicable.

An etching preventing layer 165 is formed on the second layer 154b at a position corresponding to a channel region of the oxide semiconductor layer 154.

A source electrode 173 and a drain electrode 175 are disposed on the second layer 154b of the oxide semiconductor layer 154 such that they are spaced apart from each other to overlap an edge of the etching preventing layer 165.

The etching preventing layer 165 may be partially exposed at a position where the source and drain electrodes 173 and 175 are separated.

The etching preventing layer 165 may be formed of a silicon-based oxide or a silicon-based nitride.

A passivation layer 180 is formed on the source and drain electrodes 173 and 175.

The passivation layer 180 is formed to fill a separated space between the source and drain electrodes 173 and 175 and to cover the etching preventing layer 165 exposed by the separated space.

Although not illustrated, an organic layer may be formed on the passivation layer 180.

Until now, the thin film transistor array panel having the oxide semiconductor layer 154 including the double layer of the first and second layers 154a, 154b and formed of an oxide semiconductor has been described.

Hereinafter, as an exemplary embodiment including the thin film transistor array panel 100 and a corresponding panel 200 facing the thin film transistor array panel 100 according to the present exemplary embodiment, a liquid crystal display will be described with reference to FIG. 7.

Figure 7:
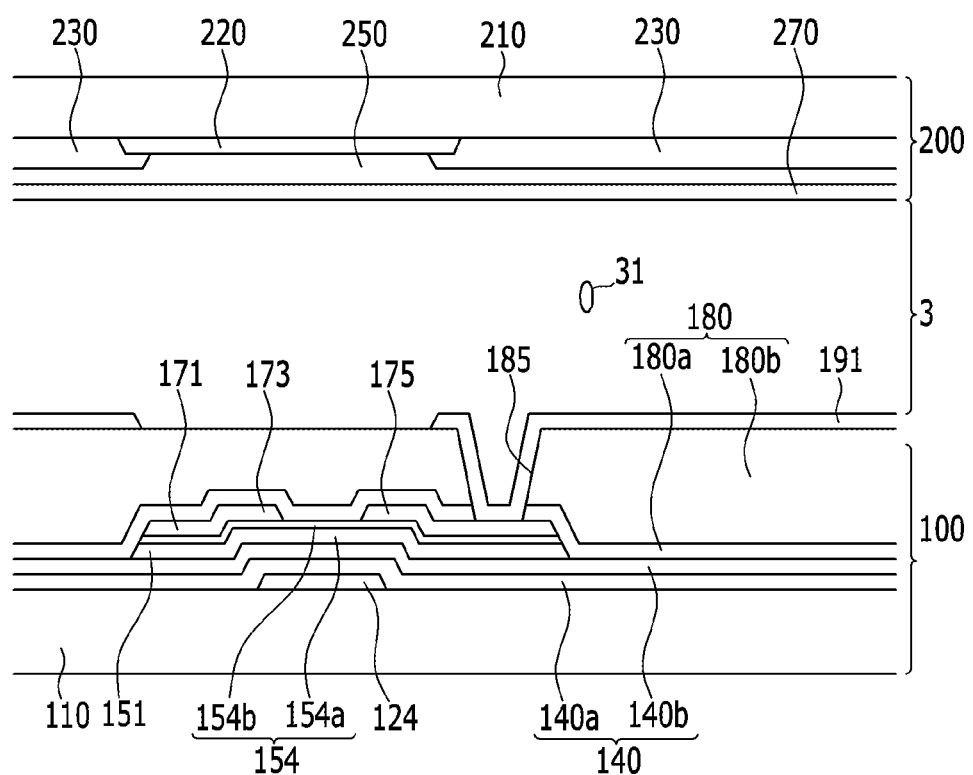
FIG. 7 is a cross-sectional view of a liquid crystal display according to the exemplary embodiment.

FIG. 7 is a cross-sectional view of a liquid crystal display according to the exemplary embodiment.

Referring to FIG. 7, a second substrate 210 is disposed to face a first substrate 110.

The second substrate 210 may be an insulation substrate formed of transparent glass or plastic.

A light blocking member 220 is formed on the second substrate 210.

The light blocking member 220 is referred to as a black matrix and prevents light leakage.

In addition, a plurality of color filters 230 are formed on the second substrate 210 and the light blocking member 220.

The color filter 230 is present in most regions surrounded by the light blocking member 220, and may be elongated along a column of the pixel electrode 191.

Each color filter 230 may display one of primary colors such as red, green, and blue.

However, the color filter 230 may display one of cyan, magenta, yellow, and white-based colors, not being limited to the three primary colors of red, green, and blue.

At least one of the light blocking member 220 and the color filter 230 may be formed on the thin film transistor array panel 100.

An overcoat 250 is formed on the color filter 230 and the light blocking member 220.

The overcoat 250 may be formed of an insulating material, and prevents the color filter 230 from being exposed in addition to providing a flat surface.

The overcoat 250 may be omitted.

A common electrode 270 is formed on the overcoat 250.

The pixel electrode 191 applied with a data voltage generates an electric field together with the common electrode 270 applied with a common voltage to determine directions of liquid crystal molecules 31 of a liquid crystal layer 3 between the two electrodes.

The pixel electrode 191 and the common electrode 270 form a capacitor to maintain the applied voltage even after the thin film transistor is turned off.

The pixel electrode 191 overlaps a storage electrode line (not shown) to form a storage capacitor, and may enhance a voltage holding capability of a liquid crystal capacitor through the storage capacitor.

The pixel electrode 191 is formed of a transparent conductor such as ITO or IZO.

A case in which the thin film transistor array panel according to the present exemplary embodiment is applied to the liquid crystal display has been previously described, but the present exemplary embodiment can be widely applicable to display devices such as an OLED display and other display devices in which the thin film transistor is used to perform switching operations.

Figure 9:
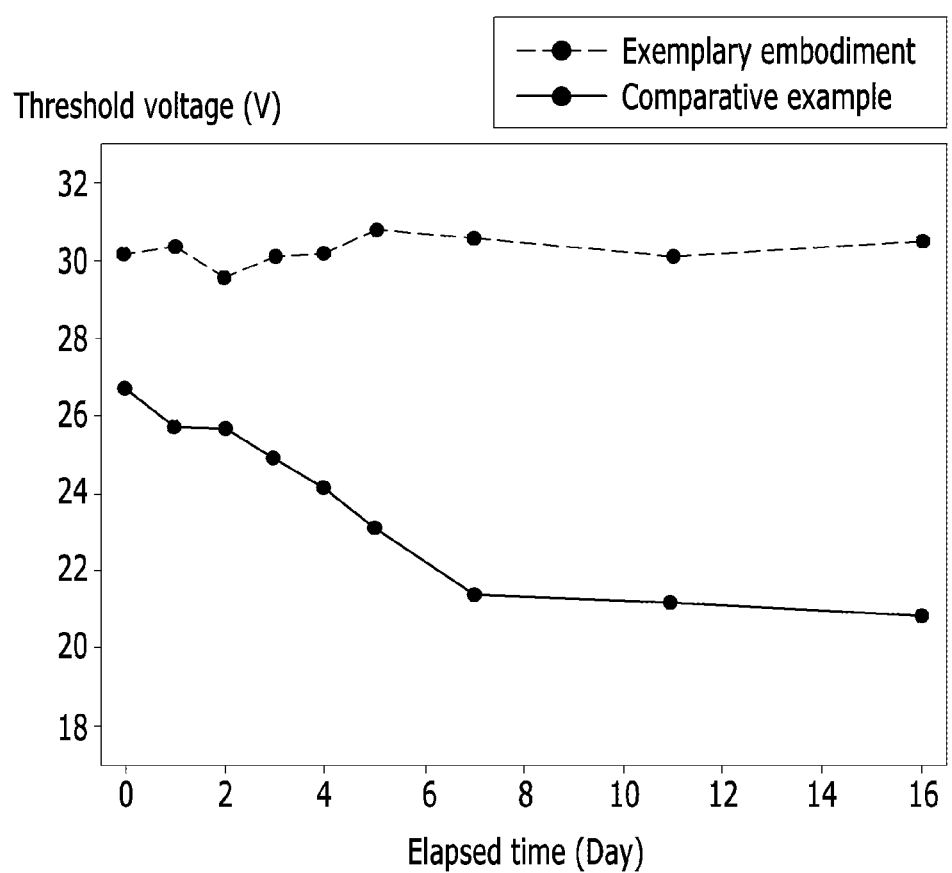
FIG. 9 is a graph showing threshold voltage variation according to elapsed time in the thin film transistor according to the comparative example and the exemplary embodiment.

FIG. 9 is a graph showing threshold voltage variation according to elapsed time in the thin film transistor according to the comparative example and the exemplary embodiment.

In FIG. 9, the comparative example, like comparative example 1 of FIG. 8, shows a case in which the thin film transistor is formed as a single layer of an amorphous oxide semiconductor layer including indium-gallium-zinc. The exemplary embodiment, like the exemplary embodiment described in FIG. 8, shows a case in which the oxide semiconductor layer is formed as a double layer.

Referring to FIG. 9, under a condition of 50% moisture and a 50° C. temperature, threshold voltage variation is observed for sixteen days and the results are shown.

The threshold voltage of the comparative example considerably drops by 6 V, but the threshold voltage of the exemplary embodiment minimally changes by less than 2 V.

Figure 10A:
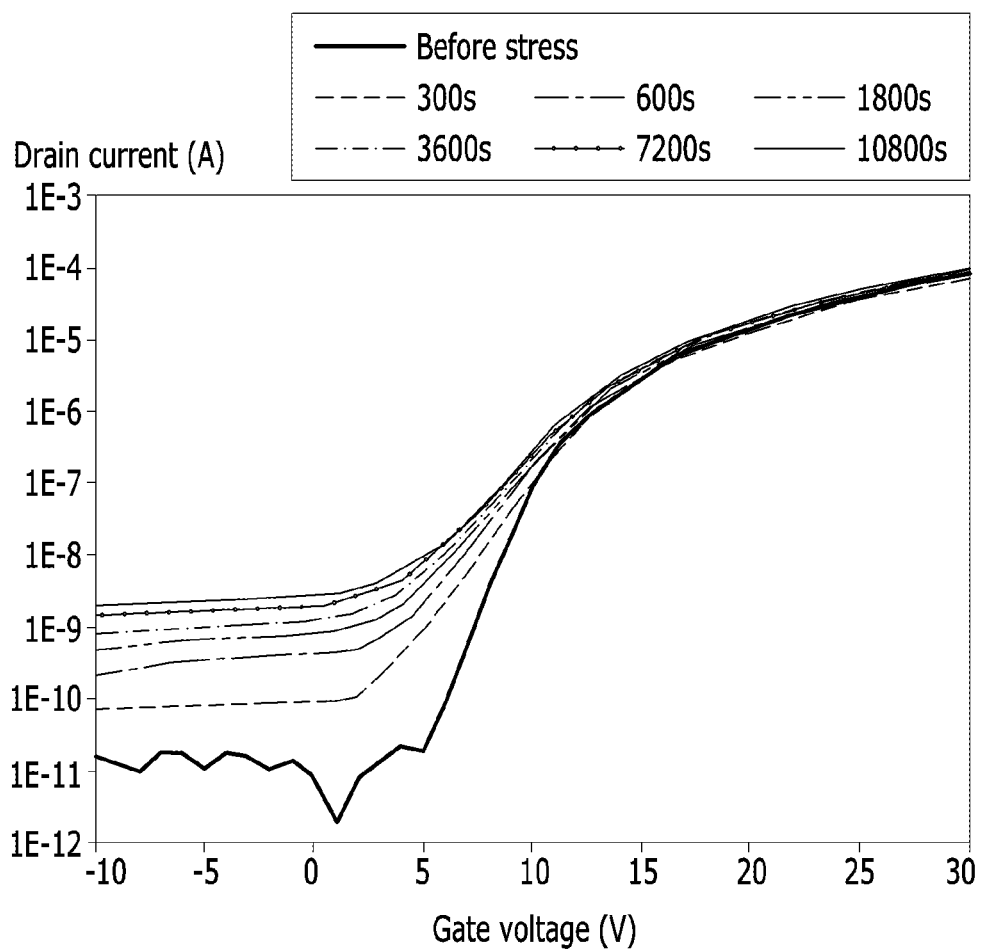
FIG. 10A is a graph showing threshold voltage variation in the comparative example.
Figure 10B:
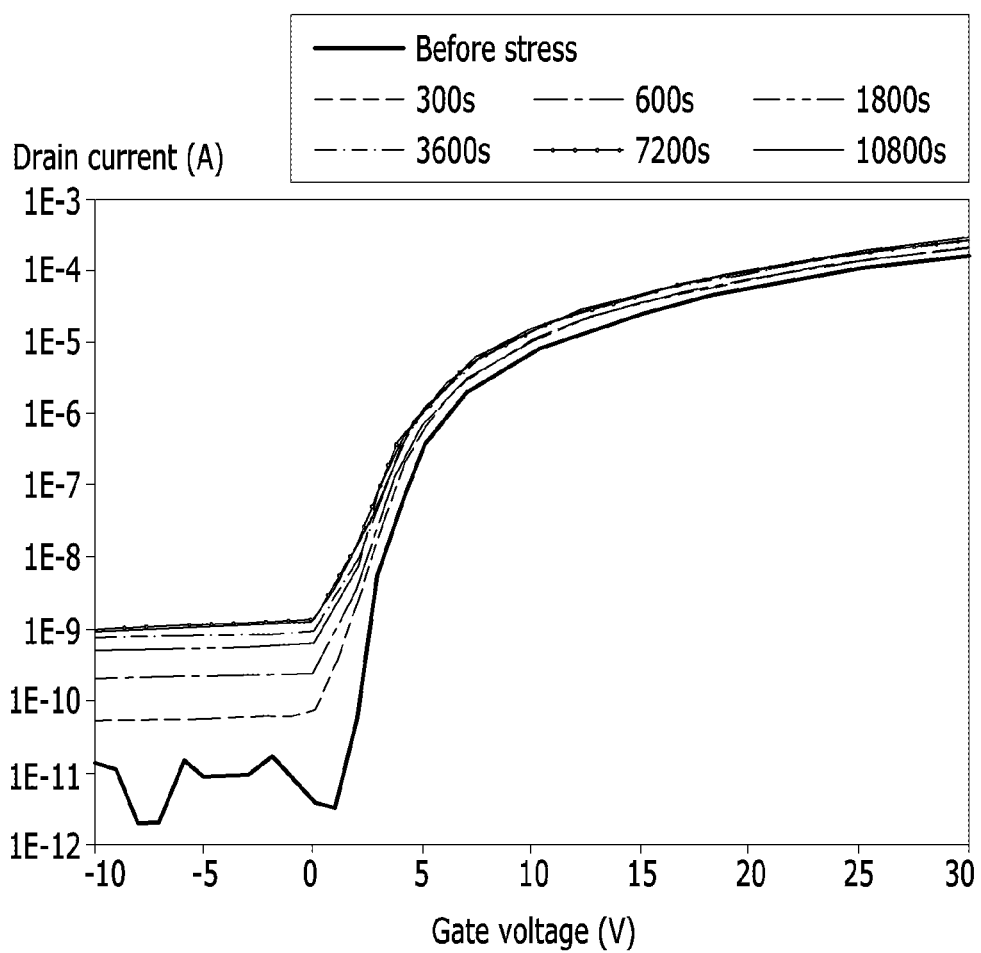
FIG. 10B is a graph showing threshold voltage variation in the thin film transistor according to the exemplary embodiment.

FIG. 10A is a graph showing threshold voltage variation in the comparative example, and FIG. 10B is a graph showing threshold voltage variation in the thin film transistor according to the exemplary embodiment.

In FIG. 10A, the comparative example, like comparative example 1 of FIG. 8, shows a case in which the thin film transistor is formed as a single layer of an amorphous oxide semiconductor layer including indium-gallium-zinc. The exemplary embodiment of FIG. 10B, like the exemplary embodiment described in FIG. 8, shows a case in which the oxide semiconductor layer is formed as a double layer.

Unlike the experiment in FIG. 9, negative bias illumination stress (NBIS) is measured to test reliability, and the results are shown.

In detail, stress of Vgs at −20 V and Vds at 0 V is applied as a negative bias, and a 6 W-365 nanometer wavelength UV lamp is irradiated.

Referring to FIGS. 10A and 10B, a variation of 2.10 V occurs in the comparative example, and a variation of 1.06 V occurs in the exemplary embodiment.

Thus, the case in which a double layer of amorphous oxide semiconductor layers including indium-gallium-zinc doped with silicon is improved in reliability, compared with the case in which the thin film transistor is formed as a single layer of an amorphous oxide semiconductor layer including indium-gallium-zinc.

Figure 11:
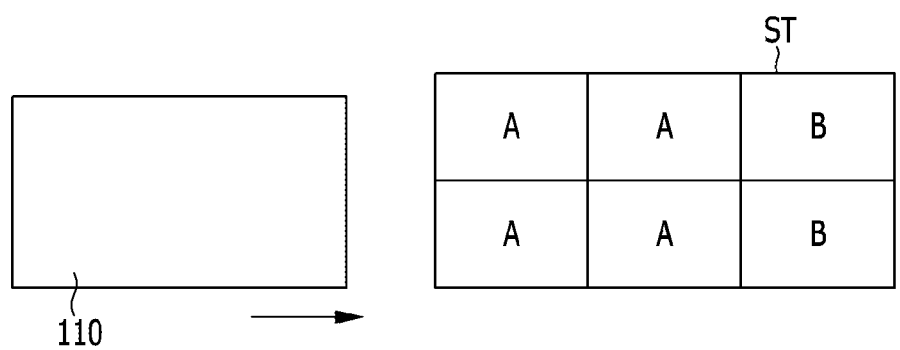
FIG. 11 is a drawing of a sputtering target in a manufacturing method of a thin film transistor array panel according to an exemplary embodiment.

FIG. 11 is a drawing of a sputtering target in a manufacturing method of a thin film transistor array panel according to an exemplary embodiment.

Referring to FIGS. 2 and 11, in order to form an oxide semiconductor layer according to the exemplary embodiment, a first layer 154a and a second layer 154b can be formed on a substrate 110 by using a sputtering process.

First, a sputtering target (ST) can be formed by combining a plurality of target sheets.

As shown in FIG. 11, a target sheet including four first target regions A and a target sheet including two first target regions B are combined to form the sputtering target (ST).

As a size becomes larger, it is difficult to form the sputtering target (ST) as one target sheet.

The target sheet including the first target regions A may include a forming material of the first layer 154a in FIG. 2, and the target sheet including the second target regions B may include a forming material of the second layer 154b in FIG. 2.

In the present exemplary embodiment, in order to form the oxide semiconductor layer by the sputtering process, the substrate 110 can be sequentially moved to the first target regions A and the second target regions B along an arrow direction of FIG. 11.

While the sputtering target ST is fixedly disposed, the substrate 110 can be moved to form the oxide semiconductor layer.

As the substrate 110 passes the first target regions A, an oxide including at least one of indium, gallium, zinc, and tin forms a layer, that is, a first layer 154a, on the substrate.

Subsequently, as the substrate 110 subsequently passes the second target regions B, a material in which an oxide including at least one of indium, gallium, zinc, and tin is mixed with silicon or a silicon oxide forms a layer, that is, a second layer 154b, on the substrate 110.

As described above, by forming the target regions of the oxide semiconductor mixed with silicon at an outmost side of the sputtering target ST, a double layer of the semiconductor layers can be formed without an additional process and equipment remodeling.

While the inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

DESCRIPTION OF SYMBOLS

| | |
|---|---|
| 110: substrate | 121: gate line |
| 151, 154: oxide semiconductor layer | |
| 171: data line | 173: source electrode |
| 175: drain electrode | 180: passivation layer |

What is claimed is:

1. A thin film transistor array panel comprising:
a substrate;
an oxide semiconductor layer disposed on the substrate;
an insulating layer disposed on the oxide semiconductor layer; and
a pixel electrode disposed on the insulating layer,
wherein the oxide semiconductor layer is a double layer consisting of a first layer and a second layer disposed on the first layer, the first layer being between the substrate and the second layer, the first layer comprising an oxide semiconductor, the second layer comprises the same oxide semiconductor as the first layer and further including silicon, and the second layer contacts the insulating layer, wherein the second layer is thinner than the first layer.

2. The thin film transistor array panel of claim 1, wherein the second layer comprises the oxide semiconductor including at least one of indium, gallium, zinc, and tin mixed with the silicon.

3. The thin film transistor array panel of claim 2, wherein the first layer comprises the oxide semiconductor including at least one of indium, gallium, zinc, and tin.

4. The thin film transistor array panel of claim 3, wherein the insulating layer includes a silicon-based oxide or nitride.

5. The thin film transistor array panel of claim 4, wherein the first layer is an indium-gallium-zinc oxide semiconductor layer, and the second layer is an indium-gallium-zinc oxide semiconductor layer doped with the silicon.

6. The thin film transistor array panel of claim 1, further comprising:
a gate insulating layer disposed on the substrate;
a gate electrode disposed on the gate insulating layer; and
source and drain electrodes disposed between the second layer and the insulating layer,
wherein the source and drain electrodes are separated from each other, and the second layer contacts the insulating layer at a separated space between the source and drain electrodes.

7. The thin film transistor array panel of claim 1, further comprising:
a gate insulating layer disposed on the substrate;
a gate electrode disposed on the gate insulating layer;
source and drain electrodes disposed between the second layer and the insulating layer and separated from each other; and
a passivation layer covering the source and drain electrodes and contacting the insulating layer in a separated space between the source and drain electrodes.

8. The thin film transistor array panel of claim 1, further comprising:
a gate electrode disposed on the insulating layer;
an interlayer insulating layer disposed on the gate electrode and including a contact hole; and
source and drain electrodes disposed on the interlayer insulating layer and connected to the oxide semiconductor layer through the contact hole.

9. The thin film transistor array panel of claim 1, further comprising:
a source electrode entirely and directly disposed on the second layer, in at least one cross sectional view; and
a drain electrode entirely and directly disposed on the second layer, in the at least one cross sectional view.

10. A thin film transistor array panel comprising:
a substrate;
an oxide semiconductor layer disposed on the substrate;
an insulating layer disposed on the oxide semiconductor layer; and
a pixel electrode disposed on the insulating layer,
wherein the oxide semiconductor layer is a double layer consisting of a first layer and a second layer disposed on the first layer, the first layer being between the substrate and the second layer,
the first layer comprises an oxide semiconductor including at least one of indium, gallium, zinc, and tin, the second layer comprises the same oxide semiconductor as the first layer doped with a material having a lower standard electrode potential (SEP) than gallium (Ga), and the second layer contacts the insulating layer, wherein the second layer is thinner than the first layer.

11. The thin film transistor array panel of claim 10, wherein
the material having the lower standard electrode potential (SEP) than the gallium (Ga) is silicon.

12. A manufacturing method of a thin film transistor array panel, comprising:
forming an oxide semiconductor layer being a double layer consisting of first and second layers on a substrate;
forming an insulating layer on the oxide semiconductor layer; and
forming a pixel electrode on the insulating layer,
wherein the second layer is formed on the first layer, the first layer being between the substrate and the second layer, the first layer comprising an oxide semiconductor, the second layer is formed of the same oxide semiconductor as the first layer and further doped with a material having a lower standard electrode potential (SEP) than gallium (Ga), and the second layer contacts the insulating layer, wherein the second layer is thinner than the first layer.

13. The manufacturing method of claim 12, wherein
the oxide semiconductor layer is formed by a sputtering method, and the first and second layers are formed by using one sputtering target.

14. The manufacturing method of claim 13, wherein
the sputtering target is formed by combining a plurality of target sheets.

15. The manufacturing method of claim 14, wherein
the sputtering target includes a first target region and a second target region,
the first target region includes a forming material of the first layer and the second target region includes a forming material of the second layer, and
the second target region is disposed at an outmost side of the sputtering target.

16. The manufacturing method of claim 15, wherein
the forming of the oxide semiconductor layer includes sequentially moving the substrate to the first target region and the second target region.

17. The manufacturing method of claim 12, wherein
the second layer comprises the oxide semiconductor including at least one of indium, gallium, zinc, and tin mixed with silicon.

18. The manufacturing method of claim 17, wherein
the first layer is the oxide semiconductor including at least one of indium, gallium, zinc, and tin.

19. The manufacturing method of claim 18, wherein
the material having the lower standard electrode potential (SEP) than the gallium (Ga) is silicon.

20. The manufacturing method of claim 19, wherein
the insulating layer includes a silicon-based oxide or nitride.

* * * * *